United States Patent [19]

Roos

[11] Patent Number: 4,758,775
[45] Date of Patent: Jul. 19, 1988

[54] BROAD BAND COUPLER
[75] Inventor: Mark D. Roos, San Carlos, Calif.
[73] Assignee: EIP Microwave, Inc., San Jose, Calif.
[21] Appl. No.: 36,752
[22] Filed: Apr. 10, 1987
[51] Int. Cl.⁴ .......................................... G01R 27/06
[52] U.S. Cl. ................................ 324/58 B; 324/58 R
[58] Field of Search ............. 324/58 B, 58.5 B, 58 R; 333/109, 110; 455/115

[56] References Cited
U.S. PATENT DOCUMENTS
3,562,642 2/1971 Hochschild .................... 324/58.5 B
4,290,009 9/1981 Sanpei ................................ 324/58 B Primary Examiner—Reinhard J. Eisenzopf
Assistant Examiner—Anthony L. Miele
Attorney, Agent, or Firm—Nilsson, Robbins, Dalgarn, Berliner, Carson & Wurst

[57] ABSTRACT

The present invention relates to microwave measurement systems and more particularly to a microwave network analyzer having a measurement head connectable between a source of radio frequency energy and a device under test which head is capable of operating over an extended band of radio frequency energy.

3 Claims, 1 Drawing Sheet

BROAD BAND COUPLER

BACKGROUND OF THE INVENTION

In the prior art of microwave vector measurements and particularly network analyzers there has existed a problem of developing data information over a broad frequency range. To accomplish coupling of mixers, amplifiers and the like to receive the energy from the radio frequency energy source and the reflected energy from the device under test, it is well recognized that microwave systems have relatively narrow operating frequency bands over which they are effective. Therefore, to provide a broad frequency band to a device under test, the prior art provided different devices for connecting to the device under test depending upon the range of frequencies of the radio frequency signal to be applied thereto. Thus it was necessary to have a multiplicity of devices for interconnecting the radio frequency signal source and the device under test. The use of such a multiplicity of devices complicates the test apparatus set up and requires the expenditure of significant time to interconnect the device under test with the test apparatus. Also each time a different interconnecting device is inserted there is a distinct probability that re-calibration of the test apparatus should be done.

As one solution to this problem there has been developed a relatively complex network employing various transformers and other components capable of operating over a relatively wide frequency range. The prior art network, however, is quite expensive and introduces unwanted complications in taking the measurements which are required.

SUMMARY OF THE INVENTION

The present invention includes means for directly connecting the RF frequency signal source to the device under test. A plurality of coupling means, each active over a predetermined band of frequencies, is discretely coupled to receive energy from the means for applying radio frequency energy to the device under test and to receive reflected energy from the device under test only over its predetermined active frequency energy band.

DETAILED DESCRIPTION

The device of the present invention is useful with a broad range of apparatus such, for example, as the Hewlett Packard HP8510A network analyzer or other devices of similar configuration which are made to operate over a broad range of radio frequency energies, for example, from 0 to 40 gigahertz and above. The present invention is directed only to the interconnection of the radio frequency energy and local oscillator signals to the device under test and the transmission of the intermediate frequencies from the device under test to the system. The network analyzer system as such is known to those skilled in the art and will not be described in detail herein. However, generally such systems are adapted to generate a radio frequency signal which may be caused to sweep in frequency over a predetermined band of frequencies ranging from 0 to 40 gigahertz and more, depending upon the particular application. That radio frequency energy signal is applied to the device under test. A local oscillator signal of desired frequency compared to the radio frequency energy signal is also generated and is applied to a mixer to which samples of the radio frequency energy being applied to the device under test and being reflected from the device under test are also discretely applied. Based upon the operation of the mixers an IF output signal is then generated which is applied to the network analyzer which provides the desired test data to the user. The present invention is specifically directed to the test head or other device which is utilized to connect the appropriate local oscillator and test energy to the device under test and to generate the IF signals and apply them to the network analyzer.

Figure 1:
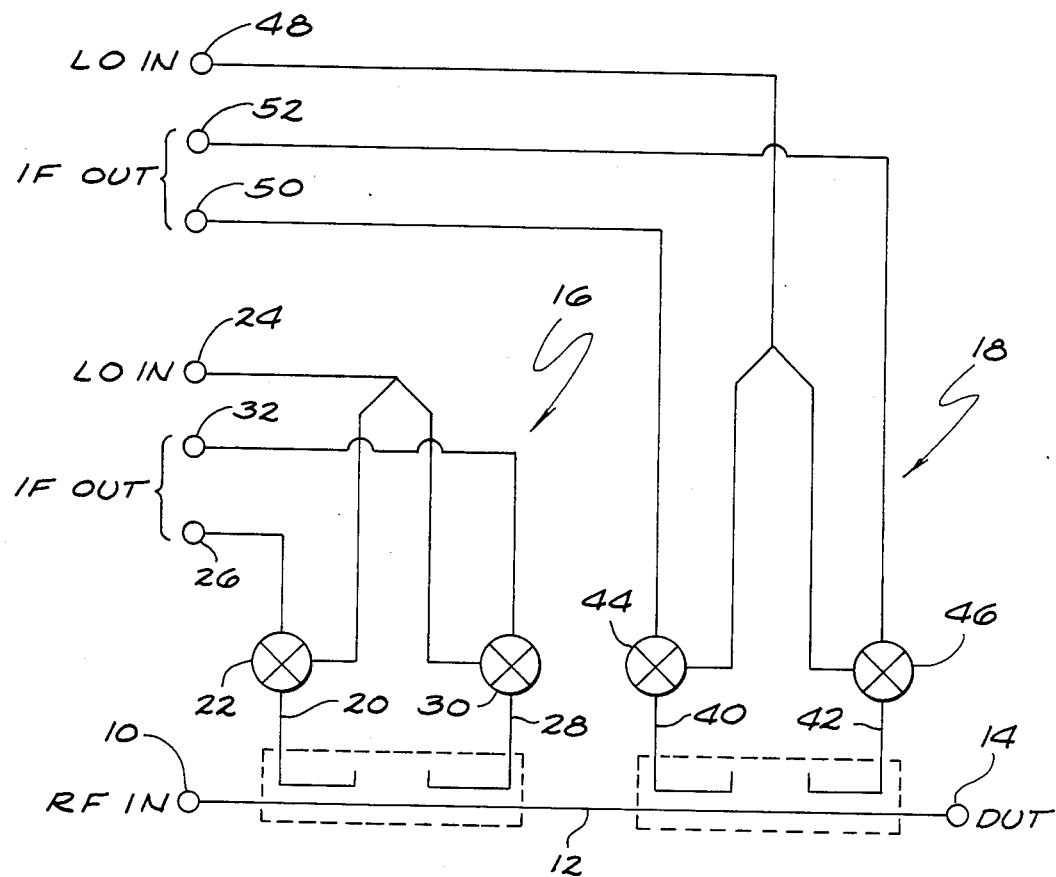
FIG. 1 is a schematic diagram illustrating an extended broad band coupler constructed in accordance with the present invention.

As is illustrated in FIG. 1, radio frequency energy of a desired frequency range is applied to a terminal 10 to which a transmission device such as a conductor 12 is coupled. The conductor 12 terminates in a terminal 14 which is used to connect the energy to the device under test. The conductor 12 is constructed of a broad band transmission device of types well known in the art which may transmit radio frequency energy over a wide frequency range, for example, from 0 to 60 gigahertz. That is, the transmission device 12 appears to the radio frequency energy as a short circuit throughout the entire range of frequencies which are desired to be coupled to a device under test.

A plurality of coupling devices, for example as shown generally at 16 and 18, are coupled to the conductor 12 for sampling radio frequency energy transmitted to the device under test and reflecting back from the device under test as is well known to those skilled in the art. Each of the coupling devices 16, 18 is functional only over a predetermined band of frequencies, that is, for example, the device 16 is active, that is, has a band pass, only over a predetermined frequency range such, for example, as from 0 to 10 gigahertz, while the device 18 would be active only over a band of frequencies, for example, a band pass from 10 to 40 gigahertz. Obviously, additional coupling devices may be coupled to the conductor 12 each being active over a preselected band of frequencies.

The coupling devices will be of the type well known to those skilled in the art. For example, the coupling device 16 may include a directional coupler 20 for receiving signal energy from the source (not shown) connected to the terminal 10. The energy sampled by the coupler 20 is connected to a mixer 22. Also connected to the mixer 22 is a local oscillator signal which is provided by a local oscillator signal generator (not shown) which is coupled to the terminal 24. By the normal operation of the mixer 22 an output IF signal is coupled to the terminal 26 which in turn would be coupled to the network analyzer for appropriately processing data that is generated.

Also included in the coupling device 16 would be a directional coupler 28 adapted to receive energy reflected from the device under test connected to the terminal 14. Also connected to the coupler 28 is an additional mixer 30 to which the local oscillator signal at the terminal 24 is also applied. The mixer 30 also provides an IF signal at the terminal 32 which is coupled to the network analyzer for appropriate processing.

Figure 2:
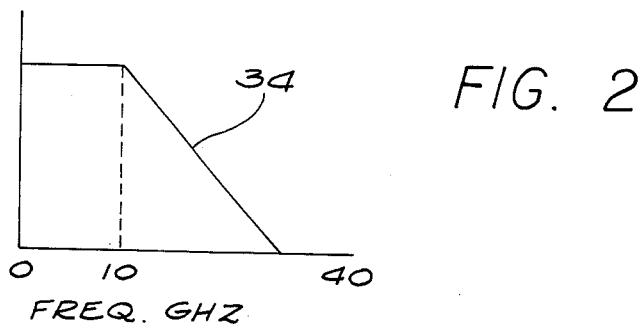
FIGS. 2 and 3 are diagrams illustrating the responsiveness of the structure as illustrated in FIG. 1.

The coupling device 16 may be active over a predetermined frequency band. For example, 0 to 10 gigahertz. With such a device the response with regard to the applied input frequency energy source would be as illustrated in FIG. 2. As is therein shown, the signal applied would be transmitted effectively over the range from 0 to 10 gigahertz. Upon reaching the 10 gigahertz frequency, the signal immediately drops off as shown at 34 to a low value and quickly becomes nonutilizable. As a result, it will be recognized by those skilled in the art that the coupling device 16 has a useful life, that is, it is active or sensitive, only to a relatively narrow band of frequencies. The particular range may be chosen at any desired width depending upon the particular applications desired.

The other coupling members, for example, as shown at 18 are constructed similarly and, for example, would include directional coupling members 40 and 42 adapted, respectively, to receive or sample the energy from the source and reflected from the device under test as above described, respectively, and would be applied to mixers 44 and 46. Also applied to the mixers 44 and 46 would be a local oscillator signal connected to the terminal 48. The output of the mixers 44 and 46 would then be applied to terminals 50 and 52 to function as above indicated.

Figure 3:
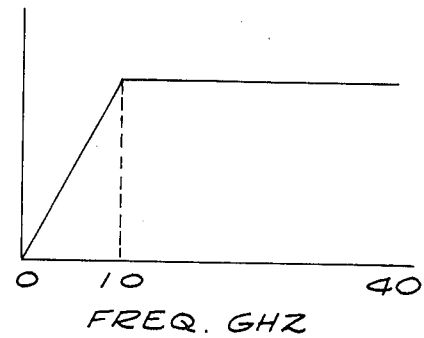

Again the connector as shown at 18 would be responsive only over a predetermined frequency band, for example, as shown in FIG. 3. As is therein illustrated, the device 18 would be effectively insensitive, that is, non-active, over the frequency range from 0 to 10 gigahertz. Between the frequencies of 10 to 40 gigahertz the coupler as shown at 18 would become sensitive or active and would provide the desired data responsive to the energy signal being applied to the device under test coupled to the terminal 14 as above described.

It should be recognized by those skilled in the art that the various couplers 16-18 with their associated mixers may be constructed as part of a single head which is connectable to or forms a part of a head that is directly attachable to the device under test and at its opposite end to a cable connected to the radio frequency energy source.

What is claimed is:

1. In a microwave measurement system for applying broad band radio frequency energy to a device under test and receiving signal information from the device under test an energy coupler comprising:
    a radio frequency energy transmission means for coupling between a source of radio frequency and a device under test to transmit said radio frequency energy to said device under test and receive energy reflections from an device under test over said entire frequency band;
    a first coupler means coupled to said transmission means for sampling transmitted and reflected radio frequency energy, said first coupler means having a first frequency band pass over a first predetermined portion, less than the whole, of the frequency band of said source; and
    a second coupler means coupled to said transmission means for sampling transmitted and reflected radio frequency energy, said second coupler means having a second frequency band pass over a second predetermined portion, less than the whole, of the frequency band of said source, said first and second frequency band passes being different.

2. An energy coupler as defined in claim 1 wherein each of said coupler means includes first and second directional couplers for discretely sampling transmitted and reflected energy respectively.

3. An energy coupler as defined in claim 2 wherein the band pass frequencies of said first and second coupler means are adjacent each other.

* * * * *